US012648444B2

(12) United States Patent
Kugel et al.

(10) Patent No.: US 12,648,444 B2
(45) Date of Patent: Jun. 2, 2026

(54) SEMICONDUCTOR PACKAGE ENABLING REDUCTION IN SEMICONDUCTOR PACKAGE SIZE

(71) Applicant: Juniper Networks, Inc., Sunnyvale, CA (US)

(72) Inventors: Valery Kugel, Mountain View, CA (US); Omar Ahmed, Richmond Hill (CA); Peng Su, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 615 days.

(21) Appl. No.: 18/165,787

(22) Filed: Feb. 7, 2023

(65) Prior Publication Data

US 2024/0186266 A1     Jun. 6, 2024

Related U.S. Application Data

(60) Provisional application No. 63/385,710, filed on Dec. 1, 2022.

(51) Int. Cl.
| | |
|---|---|
| H01L 23/00 | (2006.01) |
| H10W 42/00 | (2026.01) |
| H10W 90/00 | (2026.01) |

(52) U.S. Cl.
CPC ....... H10W 42/121 (2026.01); H10W 90/701 (2026.01)

(58) Field of Classification Search
CPC .. H01L 23/562; H01L 23/49816; H01L 24/13
See application file for complete search history.

(56) References Cited

U.S. PATENT DOCUMENTS

| | | | |
|---|---|---|---|
| 6,114,763 A * | 9/2000 | Smith | H10W 70/635 |
| | | | 257/E23.101 |
| 9,355,966 B2 | 5/2016 | Gallegos et al. | |
| 10,840,192 B1 | 11/2020 | Zohni et al. | |
| 11,222,792 B2 * | 1/2022 | Yeh | H01L 21/563 |
| 2009/0323295 A1 | 12/2009 | Houle et al. | |
| 2021/0217682 A1 | 7/2021 | Chiu et al. | |
| 2021/0305117 A1 * | 9/2021 | Lee | H01L 23/5385 |
| 2022/0181274 A1 * | 6/2022 | Kwon | H01L 23/3128 |
| 2022/0367385 A1 * | 11/2022 | Lin | H10W 42/121 |
| 2023/0035100 A1 * | 2/2023 | Patel | H01L 23/36 |
| 2023/0395526 A1 * | 12/2023 | Lai | H01L 23/562 |

OTHER PUBLICATIONS

Extended European Search Report for Application No. EP23168314.5 mailed on Oct. 26, 2023, 11 Pages.

* cited by examiner

*Primary Examiner* — Thao P Le
(74) *Attorney, Agent, or Firm* — Harrity & Harrity, LLP

(57) ABSTRACT

A semiconductor package includes a substrate, a semiconductor device, and a stiffener. The substrate has a top surface and a bottom surface. The semiconductor device is disposed on the top surface of the substrate. The stiffener is disposed on the bottom surface of the substrate. The stiffener may be disposed on a perimeter portion of the bottom surface of the substrate, and may not be disposed on a central portion of the bottom surface of the substrate. One or more connection components may disposed on the central portion of the bottom surface of the substrate, and a thickness of the stiffener may be greater than or equal to a thickness of the one or more connection components.

20 Claims, 6 Drawing Sheets

100 ⟶

SEMICONDUCTOR PACKAGE ENABLING REDUCTION IN SEMICONDUCTOR PACKAGE SIZE

CROSS-REFERENCE TO RELATED APPLICATION

This Patent Application claims priority to U.S. Provisional Patent Application No. 63/385,710, filed on Dec. 1, 2022, and entitled "SEMICONDUCTOR PACKAGE ENABLING REDUCTION IN SUBSTRATE SIZE." The disclosure of the prior Application is considered part of and is incorporated by reference into this Patent Application.

BACKGROUND

A semiconductor package includes one or more semiconductor devices, such as one or more integrated circuits. Semiconductor device components may be fabricated on semiconductor wafers, diced into dies, and then packaged. A semiconductor package may include elements, such as balls, pins, or leads, for connecting components of the semiconductor package to an external component (e.g., a circuit board).

SUMMARY

In some implementations, a semiconductor package includes a substrate having a top surface and a bottom surface; a semiconductor device disposed on the top surface of the substrate; a stiffener disposed on a perimeter portion of the bottom surface of the substrate, and not disposed on a central portion of the bottom surface of the substrate; and one or more connection components disposed on the central portion of the bottom surface of the substrate, wherein a thickness of the stiffener is greater than or equal to a thickness of the one or more connection components.

In some implementations, a semiconductor package includes a substrate having a top surface and a bottom surface; a semiconductor device disposed on the top surface of the substrate; and a stiffener having a top surface, a bottom surface, and an opening extending through the top surface and the bottom surface of the stiffener, and wherein the top surface of the stiffener is disposed on the bottom surface of the substrate, and wherein a footprint of the stiffener is greater than a footprint of the substrate.

In some implementations, a semiconductor package includes a substrate having a top surface and a bottom surface; a semiconductor device disposed on the top surface of the substrate; and a stiffener disposed on a first portion of the bottom surface of the substrate, wherein a thickness of the stiffener is greater than or equal to a thickness of one or more connection components disposed on a second portion of the bottom surface of the substrate.

DETAILED DESCRIPTION

Figure 1A:
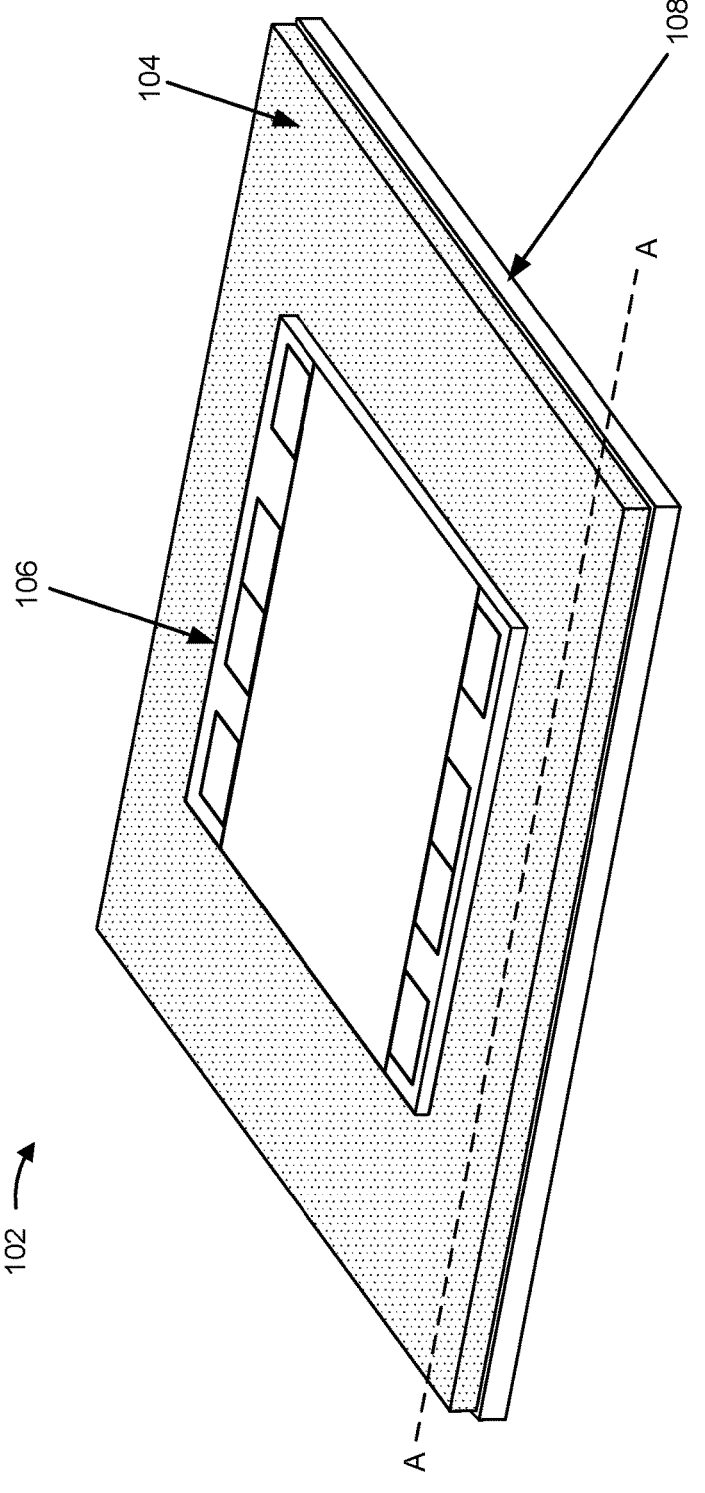
FIGS. 1A-1E show different views of an example implementation of a semiconductor package described herein.

The following detailed description of example implementations refers to the accompanying drawings. The same reference numbers in different drawings may identify the same or similar elements.

A semiconductor package may be mounted to a circuit board by one or more physical connections, such as by solder connections. For example, the semiconductor package may include a ball grid array (BGA) that facilitates connection of the semiconductor package and a circuit board by numerous solder connections (e.g., solder joints). In some cases, the semiconductor package may have a tendency to flex or bow due to temperature changes resulting from operation of the semiconductor package. This can create significant stress on the solder connections. When solder connections between the semiconductor package and the circuit board are unreliable and/or unable to withstand frequent temperature changes, damage (e.g., fracturing) to the solder connections can occur. Damage to one or more solder connections may affect the exchange of electrical signals between the semiconductor package and the circuit board, thereby impairing a functionality of the semiconductor package.

Some implementations described herein provide a stiffener for a semiconductor package. For example, the stiffener may be disposed on a bottom surface of a substrate of the semiconductor package (e.g., on an opposite surface of the substrate on which a semiconductor device of the semiconductor package is disposed). The stiffener may be configured for mechanical connection to a printed circuit board (PCB). Thus, the stiffener improves a resistance of the semiconductor package to flexing or bowing due to temperature fluctuations.

Moreover, in some implementations, the stiffener may extend beyond the footprint of the substrate, which enables the semiconductor package to have a particular footprint and therefore enables the semiconductor package to be included in an apparatus, or other component, that requires the particular footprint. As part of inclusion in the apparatus, a bottom surface of the stiffener can connect with the PCB (e.g., via one or more connection components). The stiffener therefore increases a strength of a mechanical connection between the semiconductor package and the PCB (e.g., as opposed to just a mechanical connection between the PCB and a semiconductor package that does not include the stiffener). Thus, the stiffener improves a resistance of the semiconductor package to flexing or bowing due to temperature fluctuations and an overall size of the semiconductor package can be configured to meet design requirements.

In some implementations, the stiffener may have a "tray" profile such that the stiffener is disposed on the bottom surface and one or more side surfaces of the substrate (but not a top surface of the substrate) of the semiconductor package. Thus, the stiffener may be configured to further improve a resistance of the semiconductor package to flexing or bowing under temperature fluctuations.

Figure 1B:
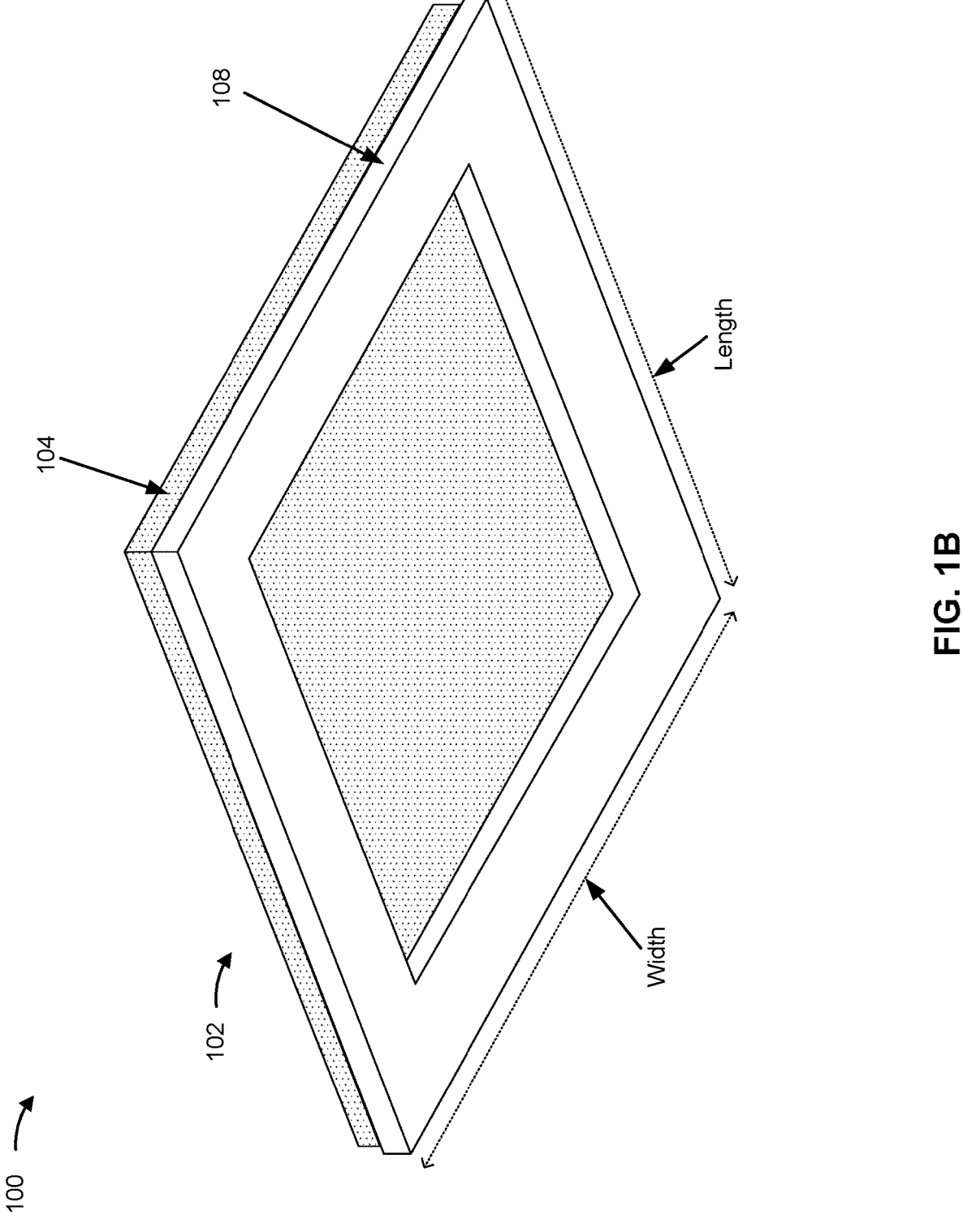
Figure 1C:
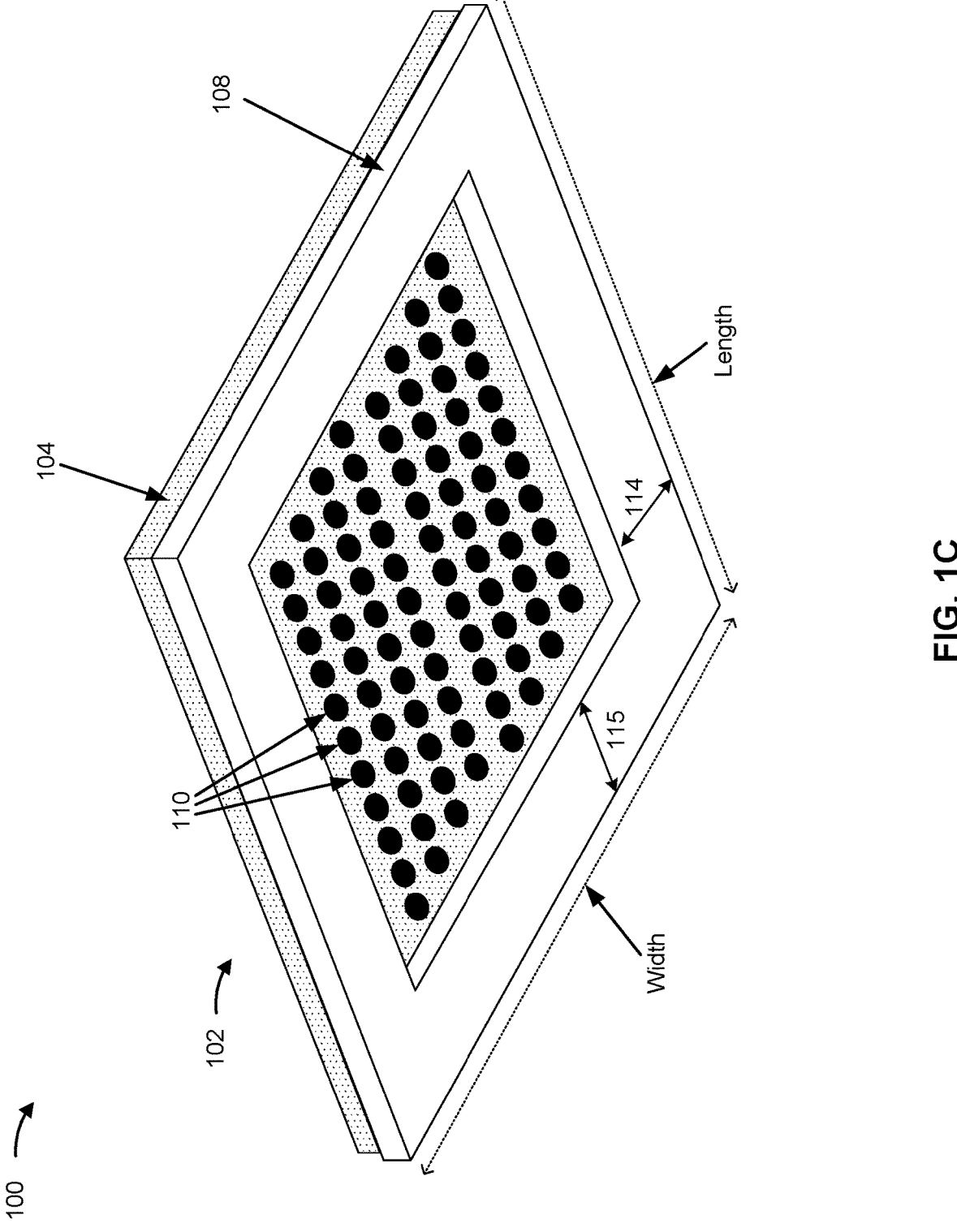
Figure 1D:
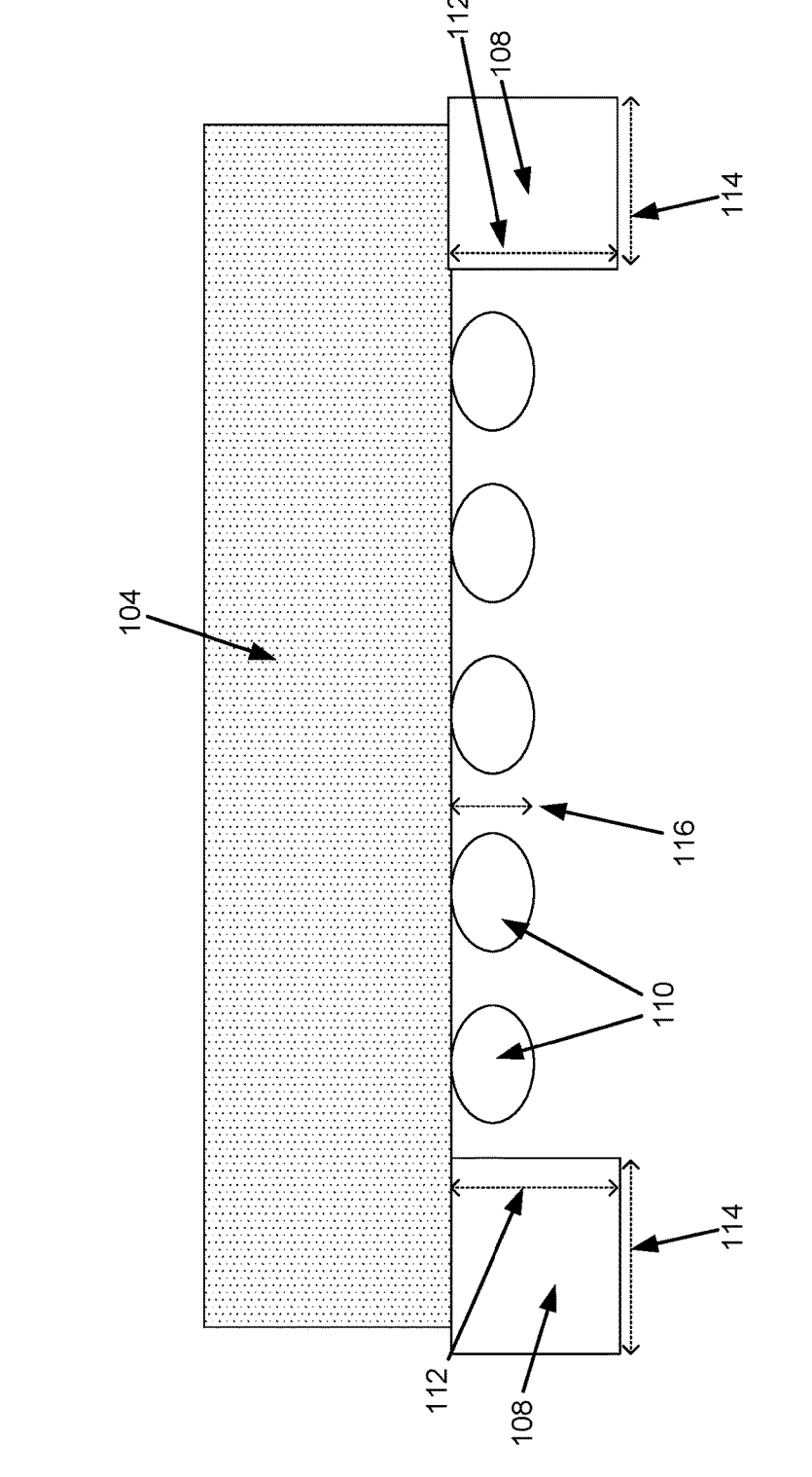
Figure 1E:
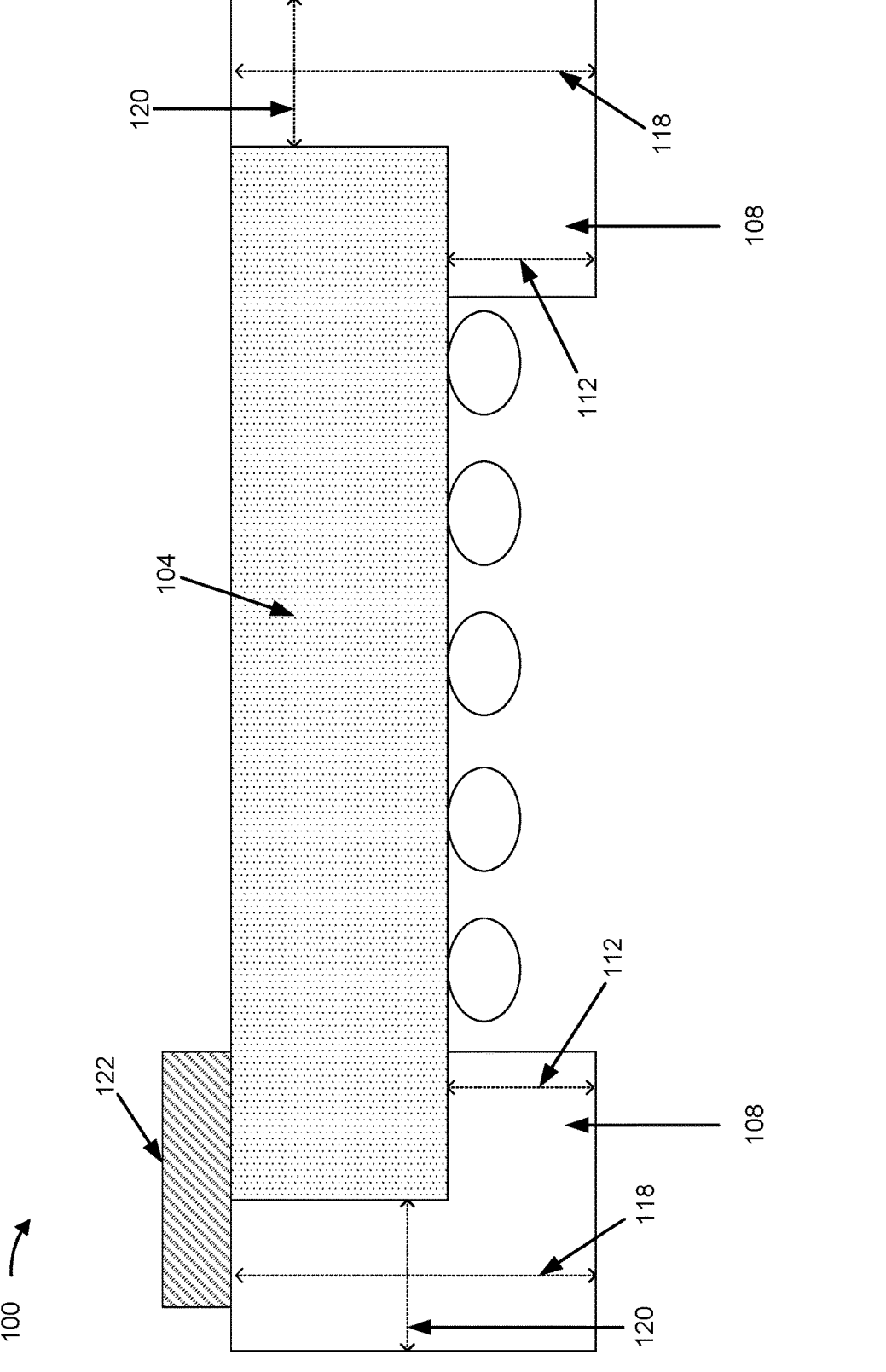

FIGS. 1A-1E show different views of an example implementation 100 of a semiconductor package 102 (which may also be referred to as a semiconductor device assembly). FIG. 1A shows a top perspective view of the semiconductor package 102; FIG. 1B shows a bottom perspective view of the semiconductor package 102; FIG. 1C shows another bottom perspective view of the semiconductor package 102; FIG. 1D shows a cross-section view of the semiconductor package 102 along the line A-A shown in FIG. 1A, and FIG. 1E shows a cross-section view of an alternative configuration of the semiconductor package 102 along the line A-A.

The semiconductor package 102 may include a substrate 104 having a top surface and a bottom surface. The substrate 104 may include a conductive or semi-conductive material (e.g., silicon, aluminum, and/or copper, among other examples), may include a PCB material, and/or may include another material. The substrate 104 may be sized and shaped (e.g., rectilinear and planar) to support one or more semiconductor devices 106 on the top surface of the substrate 104. That is, the semiconductor package 102 may include the one or more semiconductor devices 106, which may be disposed on the top surface of the substrate 104. The one or more semiconductor devices 106 may be disposed on a portion (e.g., a central portion) of the top surface of the substrate 104. The semiconductor device(s) 106 may be electrically connected to the substrate 104 (e.g., by flip-chip bonding and/or by wire bonding).

A semiconductor device 106 may include one or multiple semiconductor dies (e.g., in a stacked arrangement). A semiconductor device 106 may include an integrated circuit chip. In some implementations, a semiconductor device 106 may include an application specific integrated circuit (ASIC), which may include an integrated circuit chip that is customized for a particular use, rather than intended for a general-purpose use. Additionally, or alternatively, a semiconductor device 106 may include an application-specific standard product (ASSP) chip or an industry standard integrated circuit chip, among other examples. Additionally, or alternatively, a semiconductor device 106 may include a memory device (e.g., a device configured to store information), such as a high bandwidth memory (HBM) device that provides a high-speed computer memory interface for three-dimensional stacked synchronous dynamic random-access memory (SDRAM). In some implementations, the semiconductor package 102 may include an ASIC and one or more (e.g., two) memory devices.

In some implementations, the semiconductor package 102 may be a lidless semiconductor package. In the lidless semiconductor package, the semiconductor device(s) 106 may be exposed to allow for direct contact between the semiconductor device(s) 106 and a heat sink (not shown), thereby improving the thermal performance of the semiconductor package 102. Additionally, or alternatively, the semiconductor device(s) 106 may be exposed to allow for direct connection (e.g., to high-speed cables, or other components).

The semiconductor package 102 may include a stiffener 108 (which may also be referred to as a stiffener plate, a stiffener frame, a stiffener ring, or the like). The stiffener 108 may be disposed on a bottom surface of the substrate 104, such as shown in FIGS. 1B-1C. The stiffener 108 may comprise a rigid material, such as silicon, one or more metals (e.g., aluminum, copper, and/or an alloy, among other examples), a polymeric material (e.g., silicone rubber mixed with aluminum particles and zinc oxide), and/or another material. The stiffener 108 may comprise a material with a coefficient of thermal expansion (CTE) that is less than or equal to a CTE threshold. The CTE threshold may be, for example, less than or equal to 1 parts per million per Celsius degree (ppm/° C.), 1.3 ppm/° C., 1.5 ppm/° C., 2 ppm/° C., 3 ppm/° C., 5 ppm/° C., 7.5 ppm/° C., 10 ppm/° C., 12.5 ppm/° C., 15 ppm/° C., 17.5 ppm/° C., or 20 ppm/° C. In some implementations, the stiffener 108 (e.g., a top surface of the stiffener 108) may be affixed to the bottom surface of the substrate 104 by an adhesive, an adhesive tape, or an adhesive film, among other examples, and/or via a connecting material, such as a material comprising solder, glue, and/or epoxy.

In some implementations, the stiffener 108, may be configured to minimize warpage of the semiconductor package 102. For example, the stiffener 108 may be configured to cause warpage of the semiconductor package, during operation of the semiconductor package 102 (e.g., due to temperature fluctuations created by operation of the semiconductor package 102), to be less than or equal to a warpage threshold. The warpage threshold may be, for example, less than or equal to 100 micrometers (μm), 150 μm, 200 μm, 250 μm, 300 μm, 350 μm, or 400 μm.

In some implementations, such as shown in FIG. 1B, the stiffener 108 may be provided on a first portion (e.g., a perimeter portion) of the bottom surface of the substrate 104. Additionally, the stiffener may not be provided on a second portion (e.g., a central portion) of the bottom surface of the substrate 104. The second portion of the bottom surface of the substrate 104 may be separate from (e.g., may not overlap with) the first portion of the bottom surface of the substrate 104. The second portion may be associated with (e.g., aligned with) a portion (e.g., a central portion) of the top surface of the substrate 104, such as the portion of the top surface of the substrate 104 on which the one or more semiconductor devices 106 are disposed.

Accordingly, the stiffener 108 may have a "frame" profile (e.g., a frame-like structure, such as shown in FIGS. 1B-1C), such that the stiffener 108 has a top surface, a bottom surface, and an opening (e.g., a central opening) extending through the top surface and the bottom surface of the stiffener 108. The top surface of the stiffener 108 may be disposed on the bottom surface of the substrate 104, and therefore the top surface of the stiffener 108 may be disposed on the first portion of the bottom surface of the substrate 104, and may not be disposed on the second portion of the bottom surface of the substrate 104.

As shown in FIGS. 1A-1, the substrate 104 and the stiffener 108 may each have a width and a length. The lengths and widths of the substrate 104 and the stiffener 108 may each be, for example, greater than or equal to 85 millimeters (mm) and less than or equal to 100 mm. In some implementations, the length of the substrate 104 may be less than or equal to the length of the stiffener 108 and/or the width of the substrate 104 may be less than or equal to the width of the stiffener 108. Accordingly, the stiffener 108 may have a footprint (e.g., defined by the length and width of the stiffener 108) that is greater than or equal to a footprint of the substrate 104 (e.g., defined by the length and width of the substrate 104). Additionally, a difference between the length of the substrate 104 and the length of the stiffener 108 may satisfy (e.g., be less than or equal to) a threshold, and/or a difference between the width of the substrate 104 and the width of the stiffener 108 may satisfy the threshold. The threshold may be, for example, less than or equal to 1 mm, 2 mm, 3 mm, 5 mm, 10 mm, 15 mm, or 20 mm.

The semiconductor package 102 may have a width and a length. The width and length of the semiconductor package 102 may be defined by the width and length of the stiffener 108. That is, the width and length of the semiconductor package 102 may be the width and length of the stiffener 108, and therefore the semiconductor package 102 may have a footprint (e.g., defined by the length and width of the semiconductor package 102) that is the same as the footprint of the stiffener 108 (e.g., defined by the length and width of the stiffener 108). Accordingly, the width and length of the semiconductor package 102 may be, for example, greater than or equal to 85 mm and less than or equal to 100 mm.

As shown in FIG. 1C, the semiconductor package 102 may include one or more connection components 110 that are configured to connect (e.g., structurally connect and/or electrically connect) the semiconductor package 102 to a PCB (not shown). The one or more connection components 110 may include, for example, a ball grid array (BGA) (as shown in FIG. 1C), another PCB, an array of connectors (e.g., land grid array (LGA) connectors or pin grid array (PGA) connectors), and/or a socket (e.g., an LGA socket or a PGA socket). The one or more connection components 110 may be disposed on a bottom surface of the semiconductor package 102. For example, as shown in FIG. 1C, the one or more connection components 110 may be disposed on the second portion of the bottom surface of the substrate 104 (e.g., the portion of the bottom of the substrate 104 upon which the stiffener 108 is not disposed).

As shown in FIG. 1D, the stiffener 108 may have a thickness 112. The thickness 112 may be, for example, greater than or equal to 1 mm and less than or equal to 10 mm. In some implementations, the thickness 112 may be greater than or equal to 0.4 mm, 0.5 mm, 0.6 mm, 0.7 mm, 0.8 mm, or 0.9 mm. As further shown in FIG. 1D (and in FIG. 1C), when the stiffener 108 has a frame profile, the stiffener 108 may have a frame width 114 (e.g., a width of each length portion of the stiffener 108). The frame width 114 may be, for example, greater than or equal to 2 mm and less than or equal to 20 mm. In some implementations, the frame width 114 may be greater than or equal to 1.5 mm, 1.6 mm, 1.7 mm, 1.8 mm, or 1.9 mm. Additionally, when the stiffener 108 has a frame profile, the stiffener 108 may have a frame length 115 (e.g., a length of each width portion of the stiffener 108, shown in FIG. 1C). The frame length 115 may be, for example, greater than or equal to 2 mm and less than or equal to 20 mm. In some implementations, the frame length 115 may be greater than or equal to 1.5 mm, 1.6 mm, 1.7 mm, 1.8 mm, or 1.9 mm. In some implementations, the frame width 114 and the frame length 115 of the stiffener 108 may be the same (e.g., equal to each other), or, alternatively may be different (e.g., not equal to each other).

As further shown in FIG. 1D, the one or more connection components 110 may have a thickness 116. The thickness 116 may be, for example, greater than or equal to 0.1 mm and less than or equal to 4 mm. In some implementations, the thickness 116 may be less than or equal to the thickness 112. That is the one or more connection components may be less thick, or the same thickness, as the stiffener 108. In some implementations, the thickness 112 of the stiffener 108 may be greater than or equal to a threshold percentage of the thickness 116 of the one or more connection components 110. The threshold percentage may be greater than or equal to, for example, 75%, 76%, 77%, 78%, 79%, 80%, 85%, 90%, 95%, 100%, 110%, 125%, or 150%. In this way, the one or more connection components 110 may enable connection to a portion of a PCB, or another component, that fits within the opening of the stiffener 108.

FIG. 1E, shows an alternative configuration of the semiconductor package 102, where a portion of the stiffener 108 is disposed on one or more side surfaces of the substrate 104. That is, a first portion of the stiffener 108 may be disposed on the bottom surface of the substrate 104 (e.g., the first portion of the bottom surface of the substrate 104), and a second portion of the stiffener 108 may be disposed on the one or more side surfaces of the substrate 104 (but not the top surface of the substrate 104). In this way, the stiffener 108 may have a "tray" profile (e.g., a tray-like structure). In some implementations, the first portion of the stiffener 108 (e.g., a top surface of the first portion stiffener 108) may be affixed to the bottom surface of the substrate 104 and/or the second portion of the stiffener 108 (e.g., a side surface of the second portion of the stiffener 108) may be disposed on the one or more side surfaces of the substrate 104 by an adhesive, an adhesive tape, or an adhesive film, among other examples, and/or via a connecting material, such as a material comprising solder, glue, and/or epoxy.

As further shown in FIG. 1E, the stiffener 108 may have a tray thickness 118. The tray thickness 118 may be, for example, greater than or equal to 2 mm and less than or equal to 10 mm. In some implementations, the tray thickness 118 may be equal to a sum of the thickness 112 of the stiffener 108 and a thickness of the substrate 104, such that a top surface of the stiffener 108 is flush with a top surface of the substrate 104. Additionally, the stiffener 108 may have a tray width 120 (e.g., as measured from a side of the substrate 104). The tray width 120 may be, for example, greater than or equal to 1 mm and less than or equal to 30 mm. Accordingly, the stiffener 108 may extend beyond the footprint of the substrate 104, which enables the semiconductor package 102 to have a particular footprint and therefore enables the semiconductor package 102 to be included in an apparatus, or other component, that requires the particular footprint.

Accordingly, as further shown in FIG. 1E, another component 122 may be disposed on the top surface of the stiffener 108 and the top surface of the substrate 104 (e.g., such that the other component 122 spans the top surface of the stiffener 108 and the top surface of the substrate 104). The other component 122 may be, for example, a stiffener component that is configured to connect (e.g., structurally connect) the stiffener 108 and the substrate 104 and thereby minimize warpage of the substrate 104.

As indicated above, FIGS. 1A-1E are provided as an example. Other examples may differ from what is described with regard to FIGS. 1A-1E.

Figure 2:
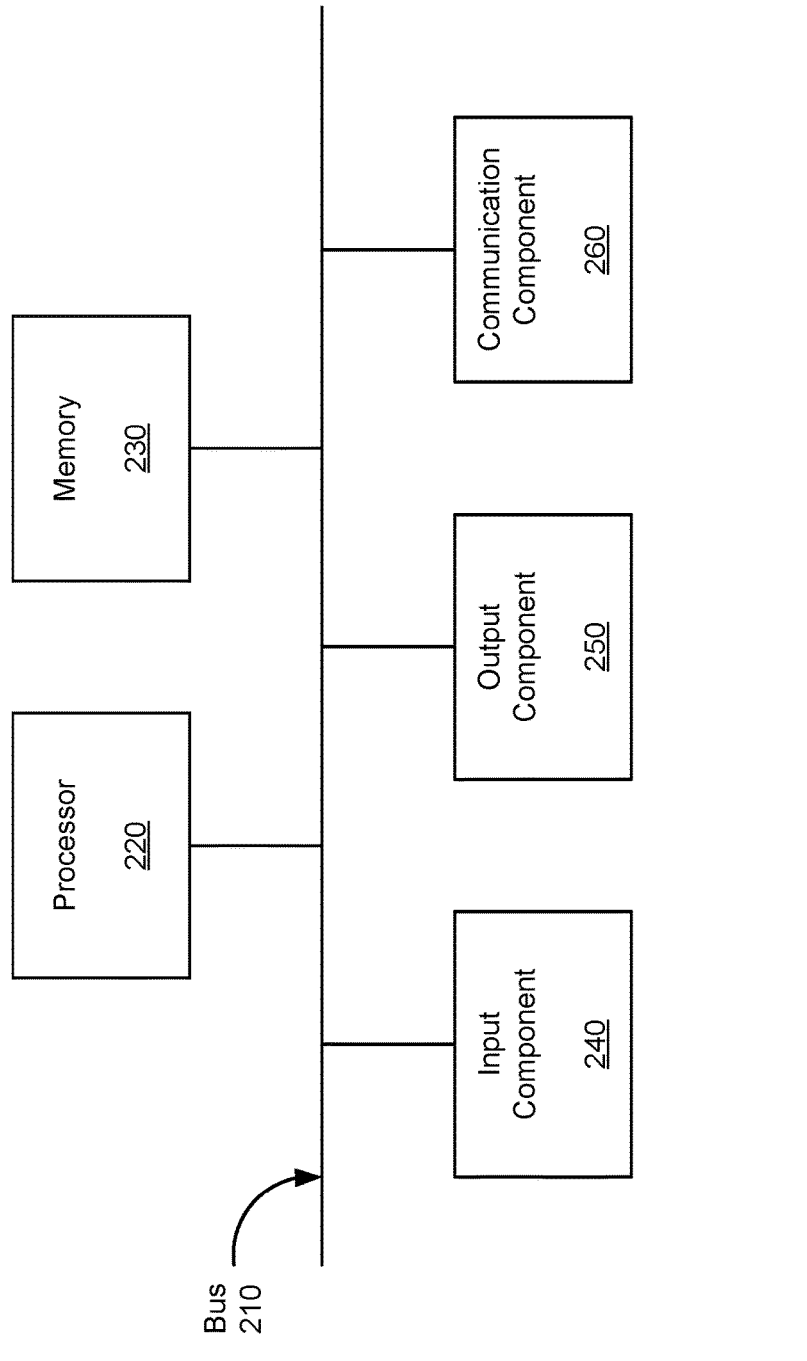
FIG. 2 is a diagram of example components of a device.

FIG. 2 is a diagram of example components of a device 200, which may correspond to the semiconductor package 102 and/or the semiconductor device 106. In some implementations, the semiconductor package 102 and/or the semiconductor device 106 may include one or more devices 200 and/or one or more components of the device 200. As shown in FIG. 2, the device 200 may include a bus 210, a processor 220, a memory 230, an input component 240, an output component 250, and/or a communication component 260.

The bus 210 may include one or more components that enable wired and/or wireless communication among the components of the device 200. The bus 210 may couple together two or more components of FIG. 2, such as via operative coupling, communicative coupling, electronic coupling, and/or electric coupling. For example, the bus 210 may include an electrical connection (e.g., a wire, a trace, and/or a lead) and/or a wireless bus. The processor 220 may include a central processing unit, a graphics processing unit, a microprocessor, a controller, a microcontroller, a digital signal processor, a field-programmable gate array, an application-specific integrated circuit, and/or another type of processing component. The processor 220 may be implemented in hardware, firmware, or a combination of hardware and software. In some implementations, the processor 220 may include one or more processors capable of being programmed to perform one or more operations or processes described elsewhere herein.

The memory 230 may include volatile and/or nonvolatile memory. For example, the memory 230 may include random access memory (RAM), read only memory (ROM), a hard disk drive, and/or another type of memory (e.g., a flash memory, a magnetic memory, and/or an optical memory). The memory 230 may include internal memory (e.g., RAM, ROM, or a hard disk drive) and/or removable memory (e.g., removable via a universal serial bus connection). The memory 230 may be a non-transitory computer-readable medium. The memory 230 may store information, one or more instructions, and/or software (e.g., one or more software applications) related to the operation of the device 200. In some implementations, the memory 230 may include one or more memories that are coupled (e.g., communicatively coupled) to one or more processors (e.g., processor 220), such as via the bus 210. Communicative coupling between a processor 220 and a memory 230 may enable the processor 220 to read and/or process information stored in the memory 230 and/or to store information in the memory 230.

The input component 240 may enable the device 200 to receive input, such as user input and/or sensed input. For example, the input component 240 may include a touch screen, a keyboard, a keypad, a mouse, a button, a microphone, a switch, a sensor, a global positioning system sensor, an accelerometer, a gyroscope, and/or an actuator. The output component 250 may enable the device 200 to provide output, such as via a display, a speaker, and/or a light-emitting diode. The communication component 260 may enable the device 200 to communicate with other devices via a wired connection and/or a wireless connection. For example, the communication component 260 may include a receiver, a transmitter, a transceiver, a modem, a network interface card, and/or an antenna.

The device 200 may perform one or more operations or processes described herein. For example, a non-transitory computer-readable medium (e.g., memory 230) may store a set of instructions (e.g., one or more instructions or code) for execution by the processor 220. The processor 220 may execute the set of instructions to perform one or more operations or processes described herein. In some implementations, execution of the set of instructions, by one or more processors 220, causes the one or more processors 220 and/or the device 200 to perform one or more operations or processes described herein. In some implementations, hard-wired circuitry may be used instead of or in combination with the instructions to perform one or more operations or processes described herein. Additionally, or alternatively, the processor 220 may be configured to perform one or more operations or processes described herein. Thus, implementations described herein are not limited to any specific combination of hardware circuitry and software.

The number and arrangement of components shown in FIG. 2 are provided as an example. The device 200 may include additional components, fewer components, different components, or differently arranged components than those shown in FIG. 2. Additionally, or alternatively, a set of components (e.g., one or more components) of the device 200 may perform one or more functions described as being performed by another set of components of the device 200.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, greater than or equal to the threshold, less than the threshold, less than or equal to the threshold, equal to the threshold, not equal to the threshold, or the like.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor package, comprising:
a substrate having a top surface and a bottom surface;
a semiconductor device disposed on the top surface of the substrate;
a stiffener disposed on a perimeter portion of the bottom surface of the substrate, and not disposed on a central portion of the bottom surface of the substrate; and
one or more connection components disposed on the central portion of the bottom surface of the substrate,
    wherein a thickness of the stiffener is greater than or equal to a thickness of the one or more connection components.

2. The semiconductor package of claim 1,
wherein the substrate further has a side surface,
    wherein a first portion of the stiffener is disposed on the perimeter portion of the bottom surface of the substrate and a second portion of the stiffener is disposed on the side surface of the substrate.

3. The semiconductor package of claim 1,
wherein the thickness of the stiffener is greater than or equal to 76% of the thickness of the one or more connection components.

4. The semiconductor package of claim 1,
wherein the semiconductor package has a width that is greater than a width of the substrate.

5. The semiconductor package of claim 1,
wherein the semiconductor package has a length that is greater than a length of the substrate.

6. The semiconductor package of claim 1,
wherein the stiffener comprises a material with a coefficient of thermal expansion that is less than or equal to 15 parts per million per Celsius degree.

7. The semiconductor package of claim 1,
wherein the semiconductor device comprises an application-specific integrated circuit (ASIC).

8. A semiconductor package, comprising:
a substrate having a top surface and a bottom surface;
a semiconductor device disposed on the top surface of the substrate; and
a stiffener having a top surface, a bottom surface, and an opening extending through the top surface and the bottom surface of the stiffener, and
    wherein the top surface of the stiffener is disposed on the bottom surface of the substrate, and
    wherein a footprint of the stiffener is greater than a footprint of the substrate.

9. The semiconductor package of claim 8,
wherein the top surface of the stiffener is not disposed on a portion of the bottom surface of the substrate that is associated with a portion of the top surface of the substrate on which the semiconductor device is disposed.

10. The semiconductor package of claim 8,
wherein the substrate further has a side surface,
    wherein a portion of the stiffener is disposed on the side surface of the substrate.

11. The semiconductor package of claim 8,
wherein the stiffener has a thickness that is greater than or equal to a thickness of one or more connection components disposed on a portion of the bottom surface of the substrate upon which the stiffener is not disposed.

12. The semiconductor package of claim 8,
wherein the stiffener has a frame width that is greater than or equal to 2 millimeters (mm) and less than or equal to 20 mm.

13. The semiconductor package of claim 8,
wherein the stiffener has a frame length that is greater than or equal to 2 millimeters (mm) and less than or equal to 20 mm.

14. The semiconductor package of claim 8,
wherein the stiffener comprises a material with a coefficient of thermal expansion that is less than or equal to 15 parts per million per Celsius degree.

15. The semiconductor package of claim 8,
wherein the stiffener is configured to cause warpage of the semiconductor package, during operation of the semiconductor package, to be less than or equal to 300 micrometers.

16. A semiconductor package, comprising:
a substrate having a top surface and a bottom surface;
a semiconductor device disposed on the top surface of the substrate; and
a stiffener disposed on a first portion of the bottom surface of the substrate,
    wherein a thickness of the stiffener is greater than or equal to a thickness of one or more connection components disposed on a second portion of the bottom surface of the substrate, and
    wherein a footprint of the stiffener is greater than a footprint of the substrate.

17. The semiconductor package of claim 16,
wherein the stiffener is not disposed on the second portion of the bottom surface of the substrate.

18. The semiconductor package of claim 16,
wherein the substrate further has a side surface,
    wherein a portion of the stiffener is disposed on the side surface of the substrate.

19. The semiconductor package of claim 16, wherein a difference between a length of the substrate and a length of the stiffener is less than or equal to a threshold.

20. The semiconductor package of claim 16, wherein the first portion is a perimeter portion.

*    *    *    *    *